(12) United States Patent
Narita et al.

(10) Patent No.: US 7,629,223 B2
(45) Date of Patent: Dec. 8, 2009

(54) METHOD FOR MANUFACTURING SEMICONDUCTOR DEVICE

(75) Inventors: Tadashi Narita, Miyagi (JP); Katsuo Oshima, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/292,511

(22) Filed: Nov. 20, 2008

(65) Prior Publication Data

US 2009/0137092 A1    May 28, 2009

(30) Foreign Application Priority Data

Nov. 27, 2007    (JP)    ............................. 2007-305510

(51) Int. Cl.
*H01L 21/76* (2006.01)
(52) U.S. Cl. ........................ 438/401; 438/196; 438/221; 438/975; 257/E23.179; 257/E21.546; 257/E21.628
(58) Field of Classification Search .................... 438/42, 438/196, 219, 353, 355, 359, 708
See application file for complete search history.

(56) References Cited

U.S. PATENT DOCUMENTS 6,573,151 B1 *    6/2003    Ramsbey et al. ............ 438/401

2005/0282396 A1 *    12/2005    Lin et al. .................... 438/745

FOREIGN PATENT DOCUMENTS

| JP | 2001-102440 | 4/2001 |
| JP | 2002-050682 | 2/2002 |
| JP | 2002-134701 | 5/2002 |

* cited by examiner

*Primary Examiner*—Savitri Mulpuri
*Assistant Examiner*—Cheung Lee
(74) *Attorney, Agent, or Firm*—Rabin & Berdo, PC

(57) ABSTRACT

A method for manufacturing a semiconductor device includes forming a plurality of trenches for element isolation and a plurality of trenches for alignment mark on a substrate. The substrate has an active region. The method also includes laminating an oxide film on the substrate and over both of the trenches. The method also includes etching the oxide film using a resist mask that masks the element isolation trenches, so that the oxide film laminated in the active region and the oxide film laminated in the alignment mark trenches are removed. The method also includes polishing a surface of the substrate to planarize or smooth the surface of the substrate. Accordingly, those portions of the oxide film which project from the substrate surface are eliminated and the oxide film remains only inside the element isolation trenches. This divides the active region into a plurality of individual active regions for the respective semiconductor elements. The method also includes positioning the resist mask using the alignment mark trenches. The resist mask is used to fabricate the semiconductor elements in the active regions of the substrate.

12 Claims, 5 Drawing Sheets

TRENCH FILLING

ACW PHOTOLITHOGRAPHY / ETCHING

STI - CMP

AM PHOTOLITHOGRAPHY / ETCHING

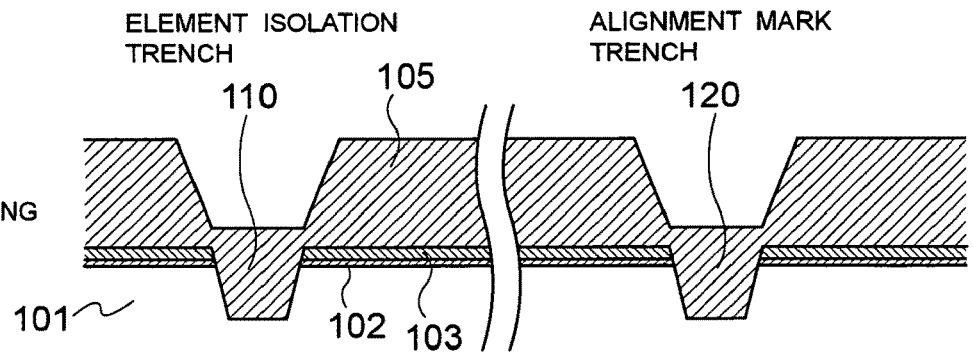
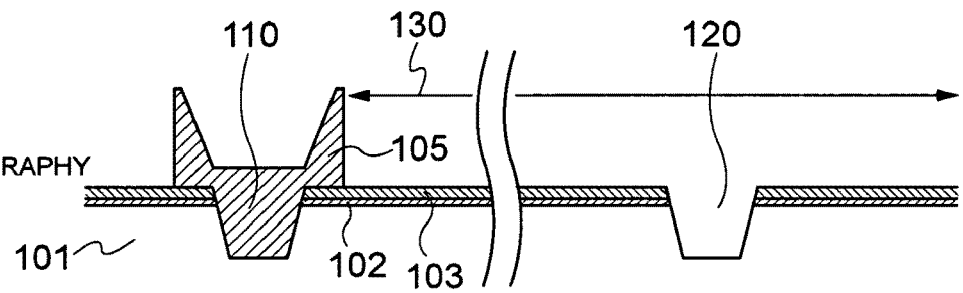
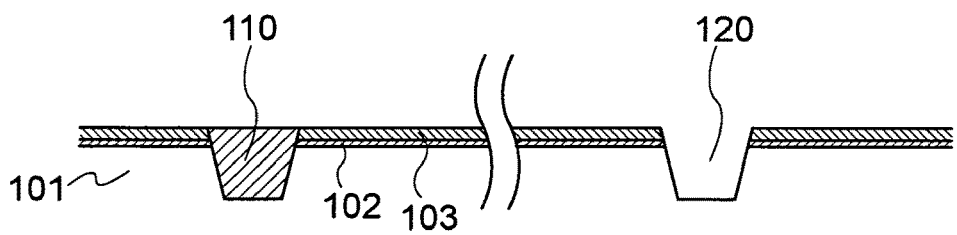
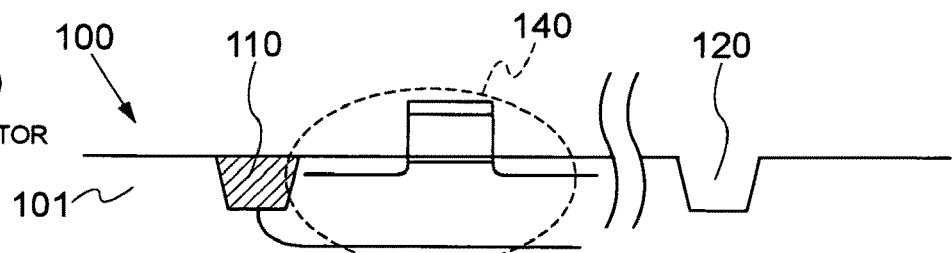

REMOVAL OF OXIDE FILM LAMINATED IN ALIGNMENT MARK TRENCH USING AM PROCESS

REMOVAL OF OXIDE FILM LAMINATED IN ALIGNMENT MARK TRENCH USING ACW PROCESS

ENLARGED SEM PHOTOGRAPH SHOWING ALIGNMENT MARK PART

CROSS-SECTIONAL VIEW OF ALIGNMENT MARK PART

TRENCH FILLING

ACW
PHOTOLITHOGRAPHY
/ ETCHING

FORMATION OF
SACRIFICIAL
OXIDE FILM

STI - CMP

SEMICONDUCTOR
ELEMENT
FORMATION

METHOD FOR MANUFACTURING SEMICONDUCTOR DEVICE

BACKGROUND OF THE INVENTION

1. Field of the Invention

The present invention relates to a method for manufacturing a semiconductor device, and in particular, to a method for manufacturing a semiconductor device which forms semiconductor elements in an active element separation region (hereinafter referred to as "active region") on a semiconductor substrate.

2. Description of the Related Art

With recent progress in integration density and functions of semiconductor devices, there is a demand for smaller element separation regions for isolating many (or more) semiconductor elements such as MOS transistors. A shallow trench isolation (hereinafter referred to as "STI") process is drawing an attention as an effective technology for providing fine element isolation (separation) regions.

The STI process is a technique that forms a groove (hereinafter referred to as "trench") on a semiconductor substrate by etching and fills the trench with an insulating material so as to separate (isolate) semiconductor elements from each other. This can decrease dimensional variations (deviations) from design (desired) dimensions of the element. Thus, the STI process is theoretically best suited for provision of fine element separation (isolation) regions. Further, the STI process has an advantage in that, after filling the trench with the insulating material, the substrate is processed by etching-back and/or chemical mechanical polishing (hereinafter referred to as "CMP") so as to have improved surface planarity (smoothness) sufficient to conduct a high precision lithographic process. Moreover, the formed trench is not only useful for the element separation but may also be used as an alignment mark for high precision positioning in a photolithographic process. In this case, an oxide film in the trench is used as the alignment mark and this oxide film must be removed by etching after the CMP process so as to maintain an alignment light at a sufficient optical waveform intensity. The alignment light is radiated on the substrate from a certain light source.

FIGS. 1A to 1D of the accompanying drawings show a conventional method for manufacturing a semiconductor device, and in particular, a process for element separation (isolation) and formation of an alignment mark using the STI process.

In a process of filling a trench shown in FIG. 1A, a pad oxide film 102 and a silicon nitride film 103 are formed in this order on a surface of a silicon substrate 101. Then, a plurality of trenches 110 and 120 are formed by photolithography and/or etching for element separation and alignment marks, respectively. Following this, the trenches 110 and 120 are filled with another oxide film 105.

In an ACW photolithography/etching process shown in FIG. 1B, the oxide film 105 formed in an active region 130 except the element separation (isolation) trenches 110 is removed by photolithography and etching. This process is carried out in order to prevent the oxide film 105 from remaining on a wide area even after a next process (i.e., STI-CMP process). ACW stands for an "active window."

In an STI-CMP process shown in FIG. 1C, the silicon substrate 101 on which some oxide film 105 remains is subjected to planarization using a CMP process. As a result of this process, the oxide film 105 remains only in the trenches 110 and 120.

In an AM photolithography/etching process shown in FIG. 1D, the oxide film 105 filled in the alignment mark trench 120 is eliminated by photolithography and etching processes. "AM" means an alignment mark. This process is necessary for the following reason. If a photolithographic process is applied to a semiconductor device having a film exhibiting high absorption of alignment light (e.g., polysilicon film), an alignment mark has an insufficient step height difference (trench depth), thus not having desired alignment waveform intensity. If the alignment waveform intensity is not sufficient, alignment precision is deteriorated and, sometimes an alignment process cannot be conducted.

On the other hand, the AM photolithography/etching process increases a production cost. In order to omit the AM photolithography/etching process, there have been some proposals. For example, Japanese Patent Application Kokai (Laid-Open) No. 2002-134701 discloses that an insulation film filled in a region, on which a large active region is formed, and a part of the insulation film filled in another region, on which an alignment mark is formed, are simultaneously eliminated by photolithography and etching (see FIG. 1C and paragraphs 0022 to 0024, and FIG. 4A and paragraphs 0034 to 0035 in the Japanese publication). Japanese Patent Application Kokai No. 2001-102440 discloses that a process of etching a separation oxide film from an alignment mark trench is performed with the same mask as that used in a process of forming a wall and/or in a process of forming a resist pattern employed for ion implantation for threshold value adjustment. Japanese Patent Application Kokai No. 2002-50682 discloses that a silicon oxide film formed in a large active region and another silicon oxide film formed in an alignment pattern trench are removed simultaneously (see FIG. 1(2) and paragraphs 0021 to 0022 in the Japanese publication).

SUMMARY OF THE INVENTION

Even if an oxide film in a large active region and another oxide film in an alignment mark part are removed simultaneously by the same process, some oxide film may remain on the alignment mark part and the oxide film may have different thickness in a single wafer and/or oxide films may have different thickness when looked at lot by lot. Therefore, deterioration of alignment precision occurs.

An object of the present invention is to provide a method for manufacturing a semiconductor device that can promise sufficient alignment precision while reducing a manufacturing cost of the semiconductor device.

According to one aspect of the present invention, there is provided an improved method for manufacturing a semiconductor device. The semiconductor device to be manufactured has a plurality of semiconductor elements in an active region defined on a semiconductor substrate. The method includes a step of forming a plurality of trenches for element separation (isolation) and a plurality of trenches for alignment mark on the substrate. The method also includes a step of laminating an oxide film on the substrate. The method also includes a step of etching the oxide film using a resist mask so as to remove the oxide film laminated in the active region and the oxide film laminated in the alignment mark trenches. The resist mask is placed to mask the element separation trenches. The method also includes a step of polishing a surface of the substrate to planarize (or smooth) a remaining portion of the oxide film laminated in the element separation trenches, so that the active region is divided into a plurality of smaller (or individual) active regions for the respective semiconductor elements. The method also includes a step of positioning the resist mask using the alignment mark trenches. The method also includes a step of forming the semiconductor elements in the individual active regions using the resist mask.

The semiconductor device manufacturing method according to the present invention does not have unnecessary photolithography and etching processes. This decreases a production cost, and ensures excellent alignment precision.

These and other objects and advantages of the invention will become apparent and more readily appreciated from the following description of the embodiments, when read and understood in conjunction with the accompanying drawings.

BRIEF DESCRIPTION OF THE DRAWINGS

FIGS. 2A to 2D are a series of schematic views illustrating a method for manufacturing a semiconductor device according to a first embodiment of the present invention;

DETAILED DESCRIPTION OF THE INVENTION

Figure 1A:
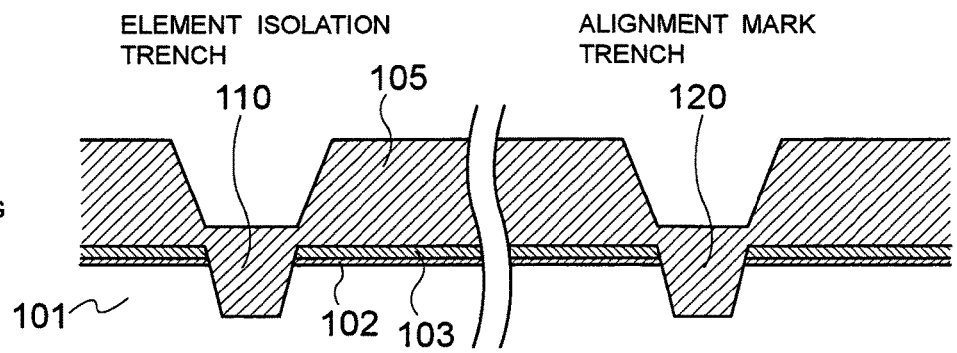
FIGS. 1A to 1D are a series of schematic views illustrating a conventional method for manufacturing a semiconductor device.
Figure 1B:
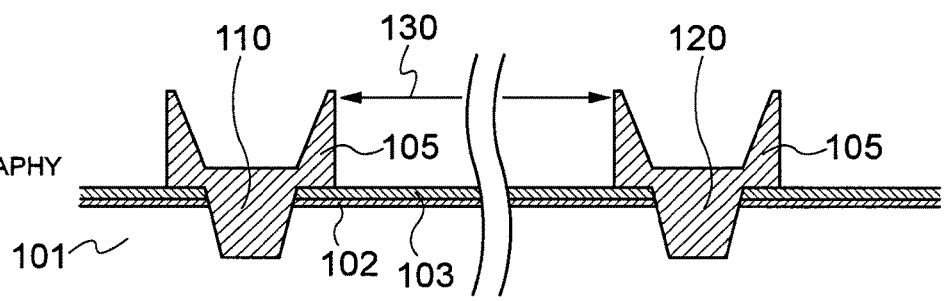
Figure 1C:
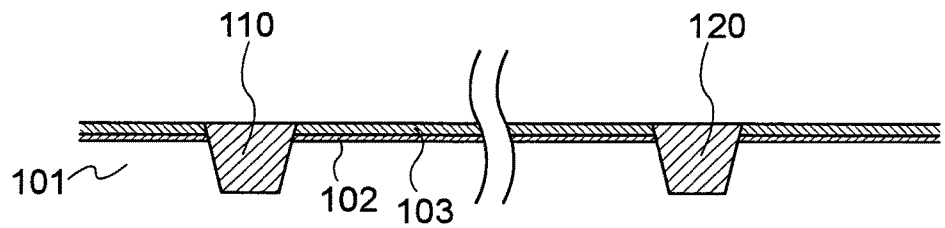
Figure 1D:
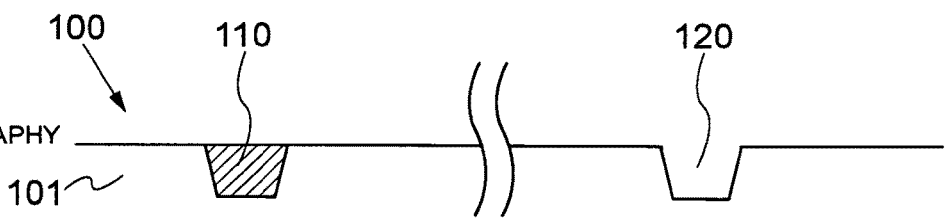

Reference will now be made in detail to the embodiments of the present invention. Like (or same) reference numerals are used in different drawings and different embodiments in order to designate like elements and parts.

Embodiment 1

This embodiment is illustrated in FIGS. 2A to 2D. These drawings are schematic views showing a method for manufacturing a semiconductor device according to one exemplary embodiment of the present invention. The semiconductor device to be manufactured includes trenches for element separation (isolation) to divide an active region on a substrate into a plurality of individual active regions. In each individual active region, a semiconductor element such as a MOS transistor is formed. The element separation (isolation) trenches are used to separate (isolate) the individual active regions from each other. The semiconductor device also includes another trenches for alignment mark. The alignment mark trenches are formed along grid lines to define an arrangement of semiconductor elements.

In a process of filling a trench as shown in FIG. 2A, a pad oxide film 102 and a silicon nitride film 103 are formed in this order on a surface of a silicon substrate 101, followed by a photolithographic process and an etching process to form a plurality of trenches 110 and 120 for element separation and alignment mark, respectively. Next, by laminating a silicon oxide film on the substrate 101, the trenches 110 and 120 are filled with another oxide film 105.

In an ACW photolithography/etching process shown in FIG. 2B, the oxide film 105 formed on an active region 130 except the element separation (isolation) trenches 110 is removed by photolithography and etching processes. Simultaneously with this, the oxide film 105 formed in the alignment mark trenches 120 is removed. That is, the ACW photolithographic process is carried out with a resist mask that exposes and develops the active region 130 and the alignment mark trenches 120, while the ACW etching process is carried out to completely remove the oxide film 105 from the alignment mark trenches 120 and the oxide film 105 from the wide active region 130 using the same resist mask. The ACW etching process exposes the silicon nitride film 103.

In practice, the etching under the optimized conditions can completely remove the oxide film laminated in a deviation-measuring mark trench and the alignment mark trench arranged on the grid line. Also, it is demonstrated that the oxide film is completely removed from the slit mark trench if the slit mark has a width from about 0.8 μm (generally called "narrow slit") to about 4 μm (generally called "wide slit").

In an STI-CMP process shown in FIG. 2C, the silicon substrate 101 on which the oxide film 105 remains is subjected to surface planarization using a CMP polishing process. As a result of the CMP polishing, the remaining oxide film 105 in the element isolation trenches 110 is planarized (is made flat) so that the active region 130 is separated into a plurality of individual active regions for a plurality of corresponding semiconductor elements. Subsequently, a cleaning process such as DHF cleaning using diluted HF is performed, followed by removal of the silicon nitride film 103 and the pad oxide film 102 using hot phosphoric acid.

In a process of forming the semiconductor elements as shown in FIG. 2D, a polysilicon film is laminated on the silicon substrate 101, and a photolithographic process is performed, using the alignment mark trenches 120 in positioning the resist mask, so as to form the semiconductor elements 140 such as transistors. Thus, the production of the semiconductor device is completed.

Figure 3A:
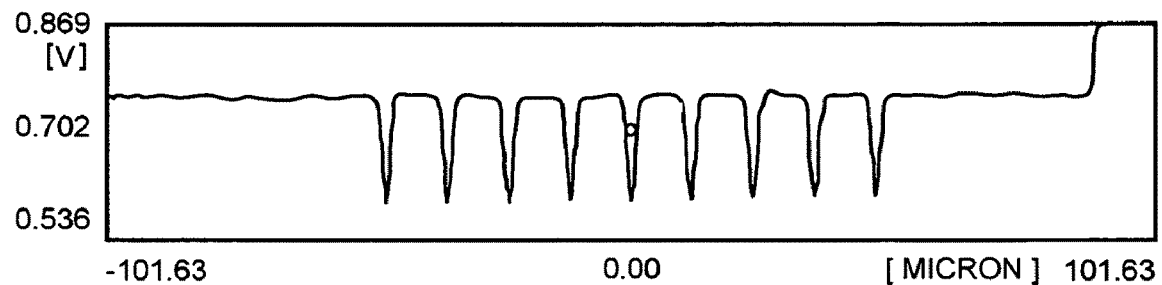
FIGS. 3A and 3B show alignment waveforms obtained under different conditions, respectively.
Figure 3B:
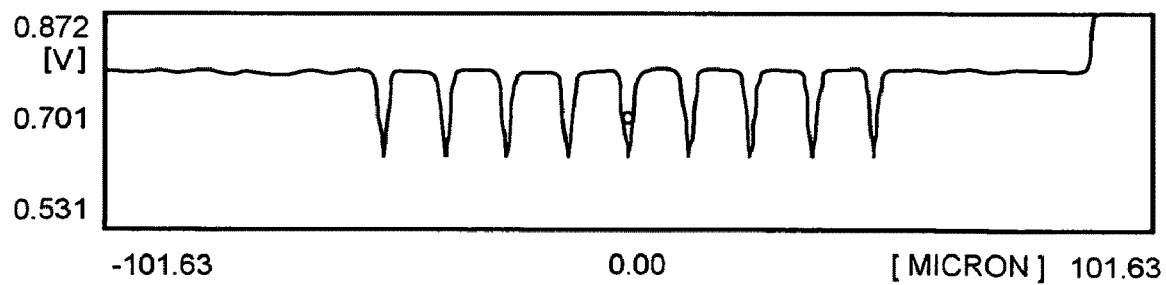

FIGS. 3A and 3B show alignment waveforms and alignment precision. Specifically, FIGS. 3A and 3B show the alignment waveforms obtained as a result of the photolithography process of FIG. 2D (the process of forming semiconductor elements) under two different conditions. FIG. 3A illustrates the case where the oxide film in the alignment mark trenches is removed using the AM photolithography and etching process, and FIG. 3B illustrates the case where the oxide film in the alignment mark trenches is removed using the ACW photolithography and etching process according to the present invention. The comparison of FIG. 3A with FIG. 3B indicates that the alignment waveform in FIG. 3A is substantially the same as the alignment waveform in FIG. 3B. This means that sufficient precision of alignment with excellent resolution is obtained in the case of FIG. 3B as in the case of FIG. 3A.

As is apparent from Embodiment 1 described above, the present invention does not require the AM photolithography/etching process to remove an oxide film from an alignment mark trench, which has been generally used in conventional methods. Therefore, the present invention can reduce the production cost. Since the AM photolithography/etching process is not required, the number of masks is reduced. This contributes to great cost reduction. In Embodiment 1, the present invention adopts an ACW photolithography/etching process to completely remove oxide films deposited in alignment mark trenches. If the oxide films are not completely removed, the oxide films remaining have uneven thickness and cause the negative influence on alignment precision. Embodiment 1 eliminates such problem.

Embodiment 2

Embodiment 2 is a modification to Embodiment 1. In Embodiment 1, a certain amount of foreign matters may be produced during the CMP process, and such foreign matters may remain in the alignment mark trenches. Embodiment 2 deals with this problem by using a sacrifice oxide film. In the ACW photolithography/etching process of Embodiment 2, the oxide film deposited in the alignment mark trenches is completely removed, and then the sacrificial oxide film is formed over the entire wafer including the alignment mark trenches, so as to eliminate foreign materials.

Figure 4A:
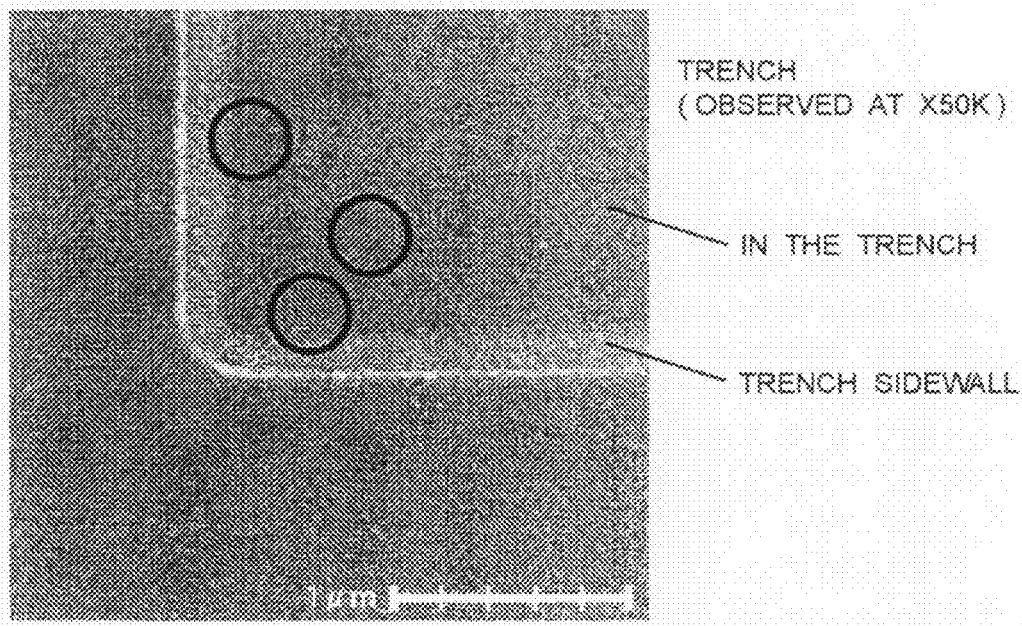
FIG. 4A is an enlarged SEM photograph of an alignment mark part.
Figure 4B:
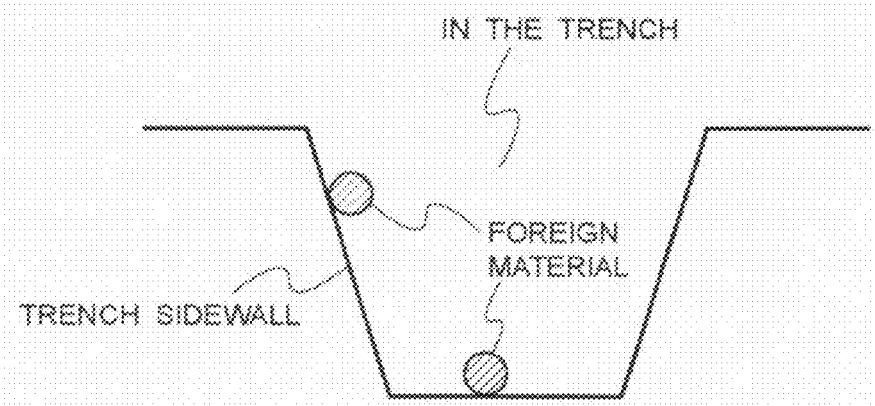
FIG. 4B illustrates a cross sectional view illustrating foreign materials remaining in the alignment mark part.

FIG. 4A is an enlarged SEM photograph showing an alignment mark part and FIG. 4B is a (virtual) cross-sectional view of the alignment mark part. Referring to FIG. 4A, a trench (TR) hole is shown in a 50K enlarged image. Some foreign materials are found in the trench. Three white circles in FIG. 4A show the locations of the foreign materials. The trench has two side walls. Referring to FIG. 4B, the foreign materials which exist in the trench (e.g., on the side wall and bottom of the trench) are shown. Such foreign materials may include polishing residues such as polishing slurry or debris of a polishing pad used in the CMP polishing process. The foreign materials may also include sharp fragments (flinders) that are fractured from the edge portion of the active region in the CMP polishing process.

Since a silicon substrate is exposed from the trench surface, it is difficult to clean up the foreign matters from the trench by DHF cleaning using diluted HF after conducting an STI-CMP process. Thus, there may be proposed a method of removing foreign matters from the trench that uses ammonium peroxide in addition to the diluted HF. However, this method may lead to excessive chemical treatment of the exposed surface of the silicon substrate. Accordingly, the proposed method may adversely affect element characteristics of the resulting semiconductor device.

After the STI-CMP process, hot phosphoric acid is often used to remove a silicon nitride film. However, the hot phosphoric acid may also etch silicon. Thus, there is a concern that the exposed silicon substrate and the surface of the alignment mark trench may be etched to have a rough surface (black Si). The rough surface may deteriorate the positioning precision (accuracy) of a resist mask in a subsequent photolithographic process.

FIGS. 5A to 5E are a series of cross sectional views illustrating a method for manufacturing a semiconductor device according to Embodiment 2. A trench filling process (FIG. 5A) and an ACW photolithography/etching process (FIG. 5B) in Embodiment 2 are substantially identical to those in Embodiment 1.

The trench filling process and the ACW photolithography/etching process are carried out. Then, a process for forming a sacrificial oxide film (FIG. 5C) is performed by forming sacrificial oxide films 107 and 108 over the entire silicon substrate wafer 101 by any suitable conventional method such as CDV or thermal oxidation. The sacrificial oxide film 108 has a controlled thickness to cover the exposed surface of the silicon substrate 101 and the surface of the alignment mark trench 120. If necessary, the thickness of the sacrificial oxide film 108 is adjusted to a value sufficient to prevent the silicon substrate 101 from being exposed and to prevent the trench surface from being exposed, even after a cleaning process following the STC-CMP process has removed foreign materials.

Figure 5A:
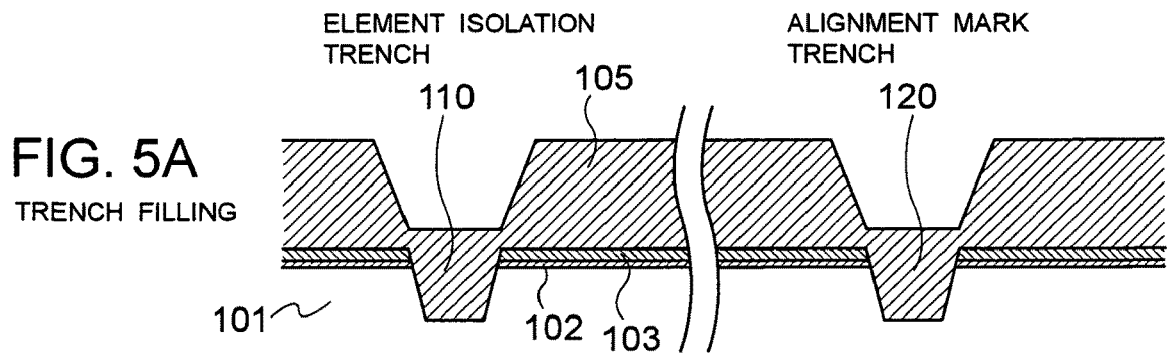
FIGS. 5A to 5E are a series of schematic views illustrating a method for manufacturing a semiconductor device according to a second embodiment of the present invention.
Figure 5B:
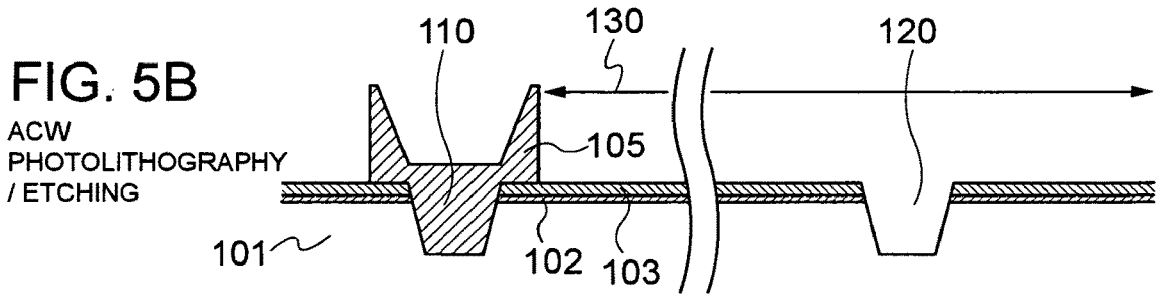
Figure 5C:
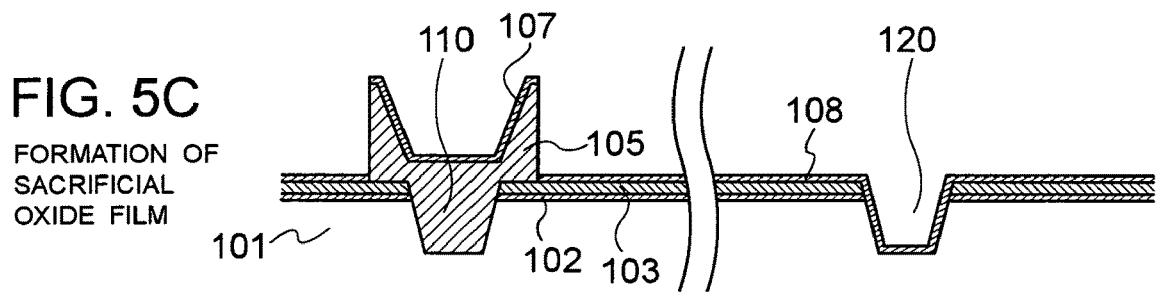
Figure 5D:
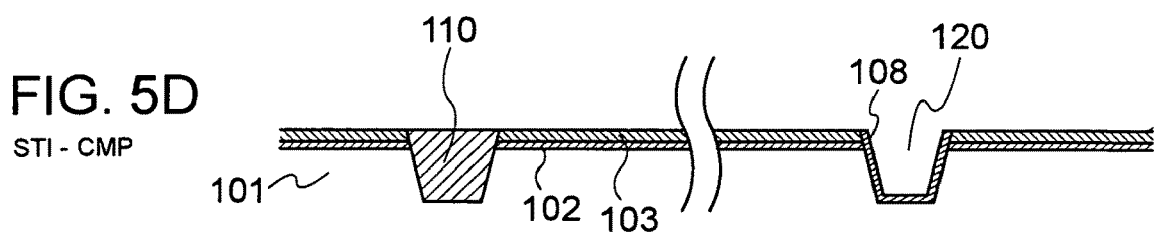

In the STI-CMP process shown in FIG. 5D, an upper surface of the silicon substrate 101 having a residue of the oxide film 105 as well as the sacrificial oxide films 107 and 108 are planarized by CMP polishing. As a result, the remaining oxide film 105 in the element separation (isolation) trench 110 is planarized so that the active region 130 is divided into a plurality of individual active regions for the semiconductor elements respectively. Thereafter, the sacrificial oxide films 107 and 108 are removed by wet etching such as DHF (diluted HF) cleaning. During the DHF cleaning, the foreign material remaining in the alignment mark trench 120 is lifted off. Then, the silicon nitride film 103 and the pad oxide film 102 are removed by hot phosphoric acid.

Figure 5E:
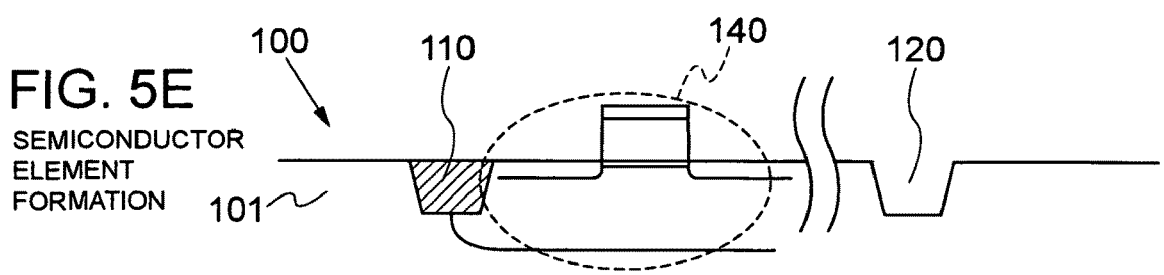

In the process for formation of a semiconductor element shown in FIG. 5E, a polysilicon film is laminated on the silicon substrate 101, and a common photolithographic process using the alignment mark trench 120 for the positioning of a resist mask is performed to fabricate semiconductor elements 140 such as transistors, thereby completing production of the semiconductor device.

As is apparent from Embodiment 2, the present invention does not require the AM photolithography/etching process thus reducing production costs. Moreover, the present invention can cover an upper surface of a silicon substrate in an alignment mark region, which is exposed by an ACW photolithography/etching process, with the sacrificial oxide film 108. Even when the trench 120 contains foreign materials such as CMP polishing slurry and/or debris of a polishing pad generated by a subsequent STI-CMP process, the sacrificial oxide film 108 is lifted off so that the foreign materials are simply (easily) eliminated by a general cleaning method such as cleaning using diluted HF (DHF). Also, sharp portions at edges of the oxide film 105 near the active region 130 are reinforced (given additional strength) by the sacrificial oxide film 107 and, therefore, the sharp portions do not become the foreign materials due to by the CMP polishing.

The foreign materials are removed from the alignment mark trench 120 by the cleaning process following the STI-CMP process, but the sacrificial oxide film 108 may maintain a thickness sufficient to prevent the silicon substrate portion 101 from being exposed and/or to prevent the trench 120 from being exposed. By providing such sacrifice oxide film 108, the surface of the silicon substrate 101 does not become rough upon etching when the silicon nitride film 103 is removed in a subsequent process. Consequently, it is possible to avoid the deterioration in controlled precision of resist mask positioning during the subsequent photolithography process.

Although a few embodiments of the present invention have been shown and described, it would be appreciated by those skilled in the art that changes and modifications may be made to these embodiments without departing from the principles and spirit of the invention, the scope of which is defined in the claims and their equivalents.

This application is based on Japanese Patent Application No. 2007-305510, filed on Nov. 27, 2007, the entire disclosure of which is incorporated herein by reference.

What is claimed is:

1. A method for manufacturing a semiconductor device, the semiconductor device to be manufactured having a plurality of semiconductor elements in an active region defined on a semiconductor substrate, said method comprising:
   a first step of forming a plurality of element isolation trenches and a plurality of alignment mark trenches on the substrate, and laminating an oxide film on the substrate and over the element isolation trenches and the alignment mark trenches;
   a second step of etching the oxide film using a resist mask, which masks the element isolation trenches, so as to remove the oxide film laminated in the active region and the oxide film laminated in the alignment mark trenches;
   a third step of planarizing or smoothing a surface of the substrate by polishing such that those portions of the oxide film which project from the surface of the substrate are eliminated and the oxide film remains only inside the element isolation trenches, whereby the active region is divided into a plurality of individual active regions for the respective semiconductor elements;

a fourth step of positioning the resist mask using the alignment mark trenches, said resist mask being used when providing the semiconductor elements; and a fifth step of providing the semiconductor elements in the plurality of individual active regions.

2. The method according to claim 1, further comprising:

a covering step of covering the alignment mark trenches with a sacrificial oxide film after the second step and before the third step; and a step of lifting off the sacrificial oxide film after the fourth step and before the fifth step.

3. The method according to claim 2, wherein the covering step also covers the oxide film laminated in the element isolation trenches with the sacrifice oxide film.

4. The method according to claim 2, wherein the lifting off step includes wet etching.

5. The method according to claim 1, wherein the semiconductor elements include MOS transistors.

6. The method according to claim 1, wherein the alignment mark trenches extend along grid lines which are used to cut the semiconductor elements.

7. The method according to claim 1, wherein the alignment mark trenches are formed by photolithography and etching, and the element isolation trenches are formed by photolithography and etching.

8. The method according to claim 1 further comprising a step of forming a PAD oxide film and a silicon nitride film on the substrate before the first step.

9. The method according to claim 1, wherein each said trench has a width from 0.8 micrometer to 4 micrometer.

10. The method according to claim 1, wherein the third step is carried out by STI-CMP process.

11. The method according to claim 1 further comprising a step of cleaning the substrate with diluted HF between the third step and fourth step.

12. The method according to claim 1 further comprising a step of removing the silicon nitride and the PAD oxide film after the cleaning step, wherein the removing step is carried with phosphoric acid.

* * * * *